United States Patent
Lee et al.

(10) Patent No.: US 12,230,568 B2
(45) Date of Patent: Feb. 18, 2025

(54) INTERCONNECTION STRUCTURE OF INTEGRATED CIRCUIT SEMICONDUCTOR DEVICE

(71) Applicant: Samsung Electronics Co., Ltd., Suwon-si (KR)

(72) Inventors: Jungha Lee, Hwaseong-si (KR); Woojin Jang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 57 days.

(21) Appl. No.: 17/856,366

(22) Filed: Jul. 1, 2022

(65) Prior Publication Data

US 2022/0352071 A1 Nov. 3, 2022

Related U.S. Application Data

(62) Division of application No. 16/922,334, filed on Jul. 7, 2020, now Pat. No. 11,393,753.

(30) Foreign Application Priority Data

Nov. 27, 2019 (KR) .................. 10-2019-0154347

(51) Int. Cl.
*H01L 23/528* (2006.01)
*H01L 21/768* (2006.01)
*H01L 23/535* (2006.01)

(52) U.S. Cl.
CPC .... *H01L 23/5283* (2013.01); *H01L 21/76805* (2013.01); *H01L 21/76816* (2013.01);
(Continued)

(58) Field of Classification Search
CPC .......... H01L 23/5283; H01L 21/76805; H01L 21/76816; H01L 21/76852;
(Continued)

(56) References Cited

U.S. PATENT DOCUMENTS 6,541,374 B1 4/2003 de Felipe et al.
7,335,590 B2 2/2008 Suh et al.
(Continued)

FOREIGN PATENT DOCUMENTS

KR 2001/0056822 A 7/2001

OTHER PUBLICATIONS

Notice of Allowance dated Mar. 4, 2022, issued in corresponding U.S. Appl. No. 16/922,334.
(Continued)

*Primary Examiner* — Amar Movva
(74) *Attorney, Agent, or Firm* — HARNESS, DICKEY & PIERCE, P.L.C.

(57) ABSTRACT

An interconnection structure of an integrated circuit semiconductor device includes: a first conductive layer on a semiconductor substrate; an interlayer insulating layer on the first conductive layer and including a trench and a via hole; a via layer in the via hole, the via layer penetrating the interlayer insulating layer through a bottom of the trench to contact the first conductive layer, the via layer including a protrusion protruding to a height greater than a height of the trench; a barrier layer selectively on the bottom and sidewalls of the trench and on sidewalls of the via layer in the trench; a cap layer on a surface of the via layer; and a second conductive layer in the trench on the barrier layer. The cap layer is electrically connected to the first conductive layer through the via layer.

20 Claims, 13 Drawing Sheets

(52) U.S. Cl.
CPC .. *H01L 21/76846* (2013.01); *H01L 21/76852* (2013.01); *H01L 21/76871* (2013.01); *H01L 21/76895* (2013.01); *H01L 23/535* (2013.01)

(58) Field of Classification Search
CPC ......... H01L 21/76871; H01L 21/76895; H01L 23/535; H01L 21/76885; H01L 21/28562; H01L 21/76844; H01L 23/5226; H01L 21/76849; H01L 21/76832; H01L 21/76831; H01L 21/76834; H01L 21/76843–76846; H01L 21/76879
See application file for complete search history.

(56) References Cited

U.S. PATENT DOCUMENTS

| | | | |
|---|---|---|---|
| 9,224,640 B2 | 12/2015 | Burke et al. | |
| 9,601,409 B2 | 3/2017 | Lu et al. | |
| 10,177,028 B1 | 1/2019 | LiCausi et al. | |
| 10,262,943 B2 | 4/2019 | Kolics et al. | |
| 2005/0224986 A1* | 10/2005 | Tseng | H01L 23/53295 257/E23.152 |
| 2006/0178002 A1* | 8/2006 | Kim | H01L 21/76808 438/622 |
| 2016/0197013 A1 | 7/2016 | Backes et al. | |
| 2017/0278747 A1* | 9/2017 | Adusumilli | H01L 21/76897 |
| 2019/0006230 A1* | 1/2019 | Kuo | H01L 21/76846 |
| 2020/0027788 A1* | 1/2020 | Peng | H01L 21/76871 |

OTHER PUBLICATIONS

Korean Office Action dated Dec. 18, 2024 for corresponding Korean Patent Application No. 10-2019-0154347 and its English-language translation.

* cited by examiner

INTERCONNECTION STRUCTURE OF INTEGRATED CIRCUIT SEMICONDUCTOR DEVICE

CROSS-REFERENCE TO RELATED APPLICATION

This application is a divisional of U.S. application Ser. No. 16/922,334, filed Jul. 7, 2020, which claims the benefit of Korean Patent Application No. 10-2019-0154347, filed on Nov. 27, 2019 in the Korean Intellectual Property Office, the disclosure of each of which is incorporated herein in its entirety by reference.

BACKGROUND

Inventive concepts relate to an integrated circuit semiconductor device, and more particularly, to an interconnection structure of an integrated circuit semiconductor device.

In a process of manufacturing an integrated circuit semiconductor device, after electronic devices such as transistors or capacitors are formed on a semiconductor substrate, a multi-layered wiring layer electrically connected to the electronic devices may be formed.

The multi-layered wiring layer may include an interconnection structure that connects a first conductive layer and a second conductive layer to a via layer. In the interconnection structure, a via resistance of the via layer needs to be reduced to improve the performance or reliability of the integrated circuit semiconductor device.

SUMMARY

Inventive concepts provide an interconnection structure of an integrated circuit semiconductor device capable of reducing via resistance of a via layer.

According to an aspect of inventive concepts, an interconnection structure of an integrated circuit semiconductor device includes: a first conductive layer on a semiconductor substrate; an interlayer insulating layer on the first conductive layer, the interlayer insulating layer including a trench; a via layer penetrating a portion of the interlayer insulating layer through a bottom of the trench to contact the first conductive layer, the via layer including a protrusion protruding to a height greater than a height of the trench; a barrier film selectively on the bottom of the trench, sidewalls of the trench, and sidewalls of the via layer in the trench; and a second conductive layer inside the trench on the barrier film, the second conductive layer being electrically connected to the first conductive layer through the via layer.

According to another aspect of inventive concepts, an interconnection structure of an integrated circuit semiconductor device includes: a first conductive layer on a semiconductor substrate; an interlayer insulating layer on the first conductive layer, the interlayer insulating layer including a trench; a via layer penetrating a portion of the interlayer insulating layer through a bottom of the trench to contact the first conductive layer, the via layer including a protrusion protruding to a height greater than a height of the trench; a barrier film selectively on a portion of a surface of the via layer, on a bottom of the trench, on sidewalls of the trench, and on sidewalls of the via layer in the trench, the barrier film exposing the via layer; and a second conductive layer on the via layer and the barrier layer, the second conductive layer filling the trench and being electrically connected to the first conductive layer through the via layer.

According to another aspect of inventive concepts, an interconnection structure of an integrated circuit semiconductor device includes: a first conductive layer on a semiconductor substrate; an interlayer insulating layer on the first conductive layer, the interlayer insulating layer including a trench and a via hole; a via layer in the via hole, the via layer penetrating the interlayer insulating layer through a bottom of the trench to contact the first conductive layer, the via layer including a protrusion protruding to a height greater than a height of the trench; a barrier film selectively on the bottom of the trench, sidewalls of the trench, and sidewalls of the via layer in the trench; a cap layer on a surface of the via layer; and a second conductive layer on the barrier film and the via layer, the second conductive layer filling the trench and being electrically connected to the first conductive layer through the cap layer and the via layer.

BRIEF DESCRIPTION OF THE DRAWINGS

Embodiments of inventive concepts will be more clearly understood from the following detailed description taken in conjunction with the accompanying drawings in which.

DETAILED DESCRIPTION

Figure 1:
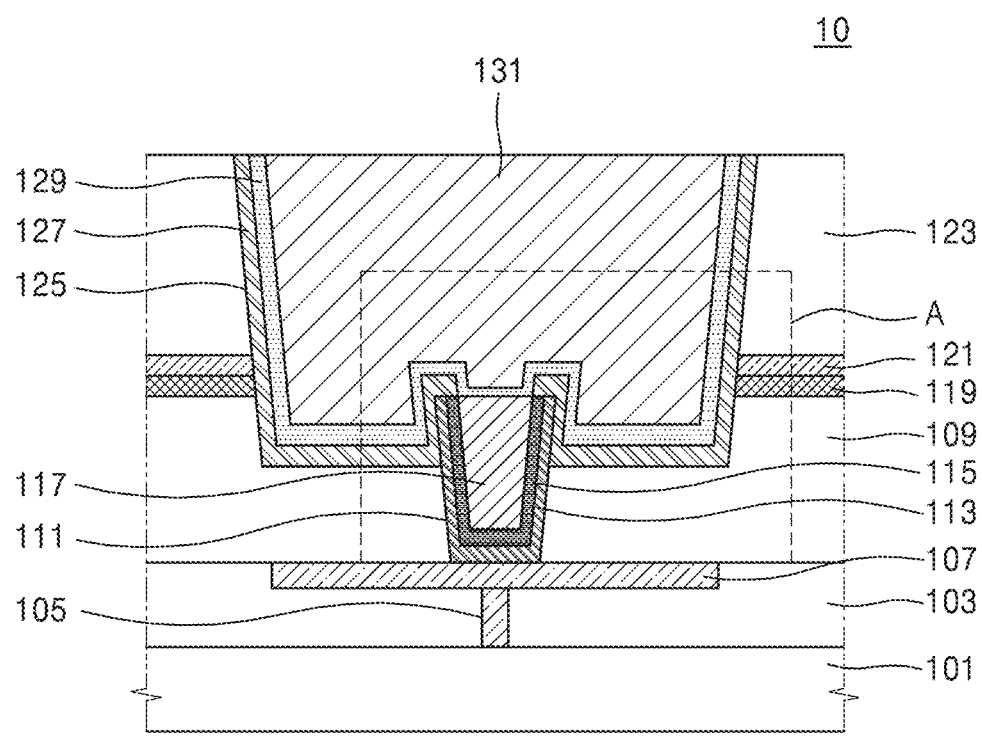
FIG. 1 is a cross-sectional view for describing an interconnection structure of an integrated circuit semiconductor device, according to an embodiment of inventive concepts.

As used herein, the singular forms "a," "an" and "the" are intended to include the plural forms as well, unless the context clearly indicates otherwise.

Hereinafter, embodiments of inventive concepts are described in detail with reference to the accompanying drawings. Identical reference numerals are used for the same constituent elements in the drawings, and duplicate descriptions thereof are omitted.

Figure 2:
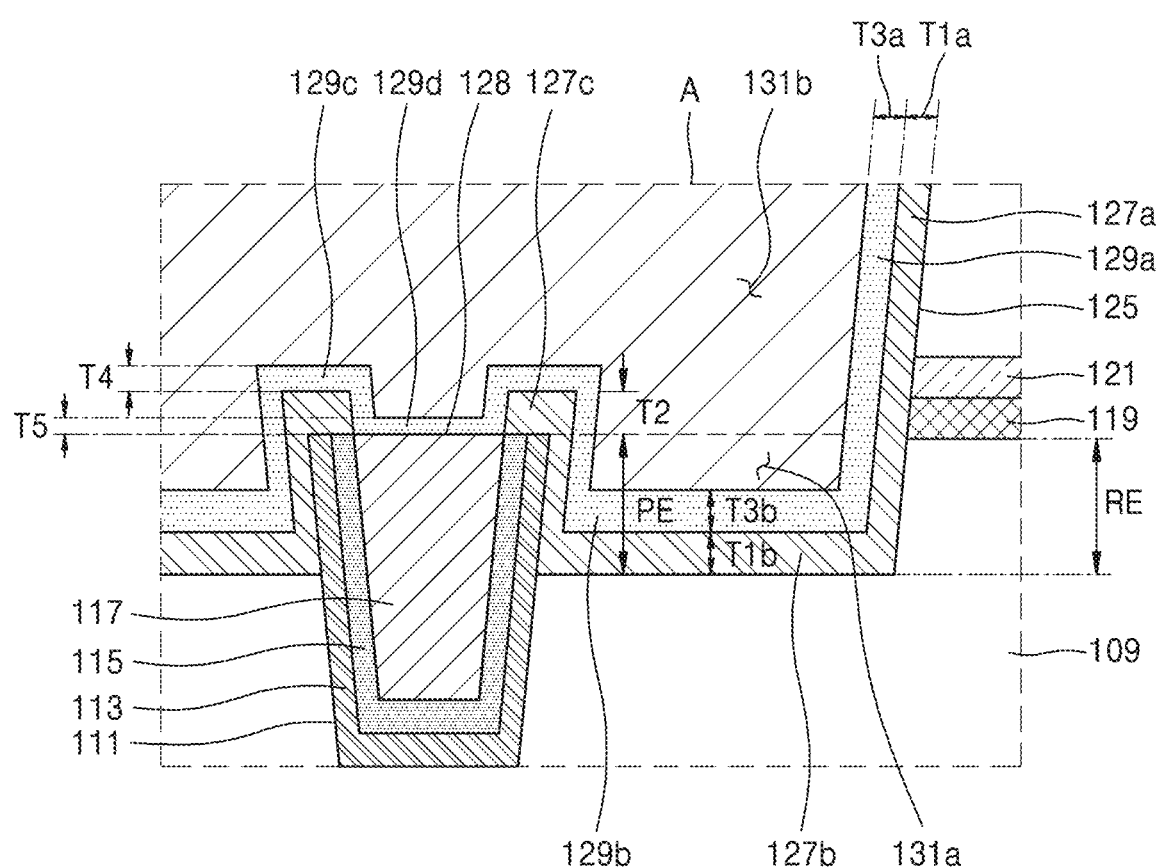
FIG. 2 is an enlarged view of a region A in FIG. 1.

FIG. 1 is a cross-sectional view for describing an interconnection structure 10 of an integrated circuit semiconductor device, according to an embodiment of inventive concepts, and FIG. 2 is an enlarged view of a region A in FIG. 2.

The interconnection structure 10 of an integrated circuit semiconductor device according to an embodiment of inventive concepts may have a single damascene structure formed by a single damascene process. The single damascene structure may be manufactured by performing an etching process for forming a via hole 111 and then by performing a trench etching process for forming a trench 125. Inventive concepts are not limited thereto and may be applied to structures other than the single damascene structure formed by the single damascene process.

The interconnection structure 10 of the integrated circuit semiconductor device may include a multi-layered wiring layer that connects a first conductive layer 107 and a second conductive layer 131 to a via layer 117. The interconnection structure 10 of the integrated circuit semiconductor device may include a semiconductor substrate 101. The semiconductor substrate 101 may include a single crystal wafer. The semiconductor substrate 101 may include a silicon wafer. Various electronic devices, for example, transistors and/or capacitors, may be formed on the semiconductor substrate 101.

A first interlayer insulating layer 103 may be formed on the semiconductor substrate 101. The first interlayer insulating layer 103 may include a silicon oxide layer. The first interlayer insulating layer 103 may be referred to as a lower interlayer insulating layer. A conductive plug 105 and a first conductive layer 107 may be formed in the first interlayer insulating layer 103.

In some embodiments, the first conductive layer 107 may include a conductive material layer including tungsten or aluminum. In some embodiments, the first conductive layer 107 may include a conductive material layer including copper. The conductive plug 105 may be electrically connected to electronic devices (not illustrated) formed on the semiconductor substrate 101 described above. The first conductive layer 107 may be referred to as a lower conductive layer or a lower wiring layer.

A second interlayer insulating layer 109, etch stop layers (119 and 121), and a third interlayer insulating layer 123 may be formed on the first conductive layer 107. The second interlayer insulating layer 109 and the third interlayer insulating layer 123 may include a silicon oxide layer. The etch stop layers (119 and 121) may include a material having an etch selectivity with respect to the second interlayer insulating layer 109 and the third interlayer insulating layer 123. The etch stop layers (119 and 121) may include a silicon nitride layer.

Although the etch stop layers (119 and 121) are illustrated as a double layer for convenience, the etch stop layers (119 and 121) may include a plurality of single layers or a plurality of triple or more layers. The second interlayer insulating layer 109 may be formed at the same height as via structures (113 and 115, and 117). The etch stop layers (119 and 121) may be formed between the second interlayer insulating layer 109 and the third interlayer insulating layer 123.

The third interlayer insulating layer 123 may be formed at the same height as upper conductive structures (127 and 129) and the second conductive layer 131. The second interlayer insulating layer 109 and the third interlayer insulating layer 123 may be collectively referred to as upper interlayer insulating layers. The second interlayer insulating layer 109, the etch stop layers (119 and 121), and the third interlayer insulating layer 123 may all be collectively referred to as upper interlayer insulating layers.

The trench 125 may be formed in the second interlayer insulating layer 109, the etch stop layers (119 and 121), and the third interlayer insulating layer 123. A bottom of the trench 125 may be formed in the second interlayer insulating layer 109. The bottom of the trench 125 may be formed at a lower location than bottoms of the etch stop layers (119 and 121). As illustrated in FIG. 2, the trench 125 may be a trench recessed by a first distance RE (or a first depth) from the bottoms of the etch stop layers (119 and 121).

In the trench 125, the via structures (113, 115, and 117) that penetrate some portion of the second interlayer insulating layer 109 and contact the first conductive layer 107 may be formed. In FIG. 1, only one set of via structures (113, 115, and 117) is illustrated for convenience, but when a width of the trench 125 is large, a plurality of via structures (113, 115, and 117) may be formed in the trench 125. The via structures (113, 115, and 117) may contact the first conductive layer 107 in the second interlayer insulating layer 109. The via structures (113, 115, and 117) may include protrusions that protrude higher than the bottom of the trench 125. Upper portions of the via structures (113, 115, and 117) may be the protrusions.

The via structures (113, 115, and 117), in particular, the via layer 117, may include the protrusion protruding from the bottom of the trench 125 by a second distance (PE, as illustrated in FIG. 2 As illustrated in FIG. 2, the trench 125 may be a trench recessed by the second distance (PE) from surfaces of the via structures (113, 115, and 117), in particular, from the surface of the via layer 117. The width of the trench 125 may be greater than widths of the via structures (113, 115, and 117), in particular, the width of the via layer 117.

The via structures (113, 115, and 117) may include the via barrier layer 113 formed inside and on a bottom of the via hole 111, the via seed layer 115 formed on the via barrier layer 113, and the via layer 117 formed to fill the via hole 111 on the via seed layer 115.

In some embodiments, the via barrier layer 113 may include a single layer or a multiple layer of TaN, TiN, Ti, and Ta. In some embodiments, the via seed layer 115 may include Co or Ru. In some embodiments, the via layer 117 may include a conductive material layer including tungsten or aluminum. In some embodiments, the via layer 117 may include a conductive material layer including copper.

The via hole 111 may expose a surface of the first conductive layer 107 and penetrate a portion of the second interlayer insulating layer 109. The via barrier layer 113 may limit and/or prevent diffusion of atoms constituting the via layer 117. The via seed layer 115 may be a material layer that functions as a seed so that the via layer 117 is easily formed on the via barrier layer 113. The via seed layer 115 may be a wetting layer that allows the via layer 117 to adhere well to the via barrier layer 113.

The interconnection structure 10 of the integrated circuit semiconductor device may include upper conductive structures (127, 129, and 131) that are in contact with the via structures (113, 115, and 117), while filling the trench 125. The upper conductive structures (127, 129, and 131) may contact portions of both sidewalls of the via structures (113, 115, and 117). Since the upper conductive structures (127, 129, and 131) contact portions of both sidewalls of the via structures (113, 115, and 117), contact areas therebetween may be increased. Accordingly, the interconnection structure 10 of the integrated circuit semiconductor device may reduce resistance of the via structures (113, 115, and 117), such as a via resistance.

The upper conductive structures (127, 129, and 131) may include a barrier film 127 (e.g., single or multilayer barrier), a conductive seed layer 129 formed on the barrier film 127, and the second conductive layer 131 formed to bury the trench 125 on the conductive seed layer 129.

In some embodiments, the barrier film 127 may include a single layer or a multiple layer of TaN, TiN, Ti, and Ta. In some embodiments, the conductive seed layer 129 may include Co or Ru. In some embodiments, the second conductive layer 131 may include a conductive material layer including tungsten or aluminum. In some embodiments, the second conductive layer 131 may include a conductive material layer including copper.

The barrier film 127 may be formed selectively on sidewalls and the bottom of the trench 125. The barrier film 127 may not be formed selectively on top surfaces of the via structures (113, 115, and 117), in particular, on a top surface of the via layer 117. The barrier film 127 may be formed by using an atomic layer deposition (ALD) method, a chemical vapor deposition (CVD) method, or a physical vapor deposition (PVD) method.

As illustrated in FIG. 2, the barrier film 127 may include a first portion 127a formed on the sidewall of the trench 125, and a second portion 127b formed on the bottom of the trench 125 and some side surfaces of the via barrier layer 113. In some embodiments, as illustrated in FIG. 2, the barrier film 127 may include a third portion 127c formed on top portions of the via barrier layer 113 and the via seed layer 115.

The barrier film 127 may have first thicknesses (T1a and T1b) and a second thickness T2. The first portion 127a of the barrier film 127 may have a first sub thickness T1a. The second portion 127b of the barrier film 127 formed on the bottom of the trench 125 may have a second sub thickness T1b that is greater than the first sub thickness T1a. The third portion 127c of the barrier film 127 may have the second thickness T2 that is about the same as the second sub thickness T1b.

The barrier film 127 may limit and/or prevent diffusion of atoms constituting the second conductive layer 131. The conductive seed layer 129 may be a material layer that functions as a seed so that the second conductive layer 131 is easily formed on the barrier film 127. The conductive seed layer 129 may be a wetting layer that allows the second conductive layer 131 to adhere well to the barrier film 127.

As illustrated in FIG. 2, the conductive seed layer 129 may include a first portion 129a formed on sidewalls of the barrier film 127a of the trench 125, a second portion 129b formed on the barrier film 127b that is formed on the bottom of the trench 125 and on some side surfaces of the via barrier layer 113, a third portion 129c formed on the barrier film 127c that is on the via barrier layer 113 and the via seed layer 115, and a fourth portion 129d formed on the via layer 117.

The conductive seed layer 129 may have third thicknesses (T3a and T3b), a fourth thickness T4, and a fifth thickness T5. The first portion 129a of the conductive seed layer 129 may have a third sub thickness T3a. The second portion 129b of the conductive seed layer 129 may have a fourth sub thickness T3b that is greater than the third sub thickness T3a. The third portion 129c of the conductive seed layer 129 may have the fourth thickness T4 that is less than the third thicknesses (T3a and T3b), and the fourth portion 129d of the conductive seed layer may have the fifth thickness T5 that is less than the fourth thickness T4.

The second conductive layer 131 may be referred to as an upper conductive layer or an upper wiring layer. The second conductive layer 131 may be electrically connected to the first conductive layer 107 via the via layer 117. As illustrated in FIG. 2, the second conductive layer 131 may include a first portion 131a at the same height as the upper surface of the via structures (113, 115, and 117), for example, the upper surface of the via layer 117, and a second portion 131b at the same height as an upper surface of the third interlayer insulating layer 123 on the first portion 131a, and the first portion 131a and the second portion 131b may be configured in one body.

As illustrated in FIGS. 1 and 2, the interconnection structure 10 of the integrated circuit semiconductor device of inventive concepts may not include the barrier film 127 formed on a top surface 128 of the via layer 117, but may include the conductive seed layer 129 and the second conductive layer 131 thereon (e.g., on the via layer 117). Accordingly, a contact resistance between the second conductive layer 131 and the via layer 117 may be reduced.

In addition, the interconnection structure 10 of the integrated circuit semiconductor device of inventive concepts may include the second conductive layer 131 in the trench 125 that has a width greater than the via layer 117 on the top surface of the via layer 117 and is recessed downward from the top surface of the via layer 117. Accordingly, a contact area between the via layer 117 and the second conductive layer 131 may be increased, and thus, a contact resistance between the second conductive layer 131 and the via layer 117 may be reduced.

As a result, in the interconnection structure 10 of the integrated circuit semiconductor device of inventive concepts, the barrier film 127 may not be selectively formed on the via layer 117, and a via resistance of the via layer 117 may be reduced by increasing the contact area between the via layer 117 and the second conductive layer 131.

Figure 3:
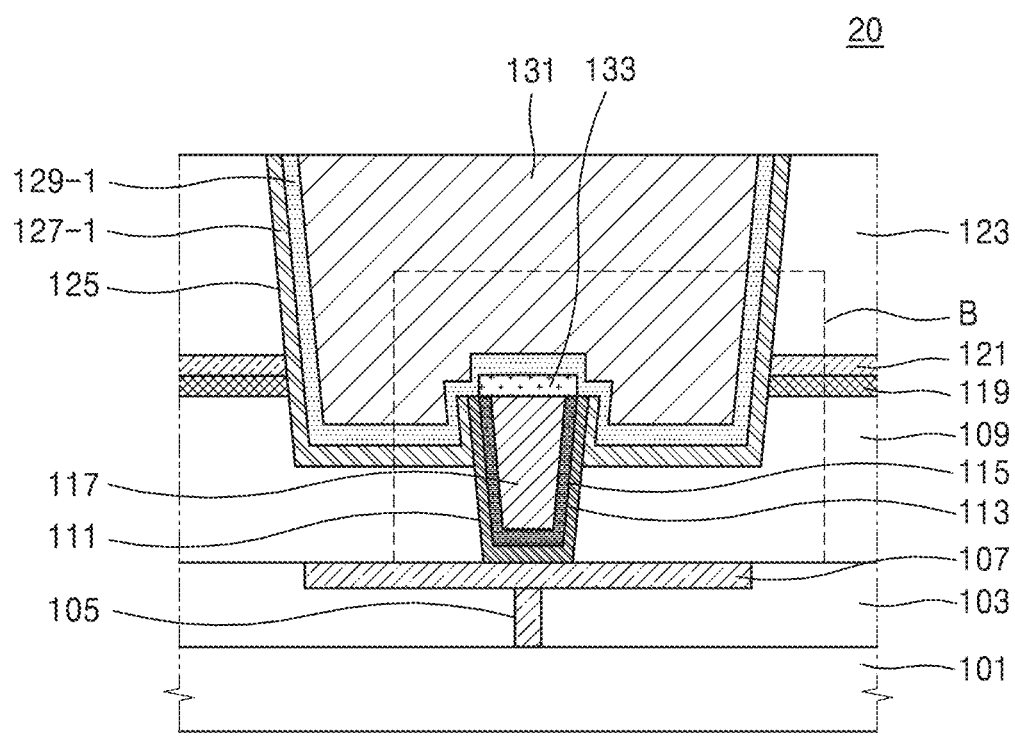
FIG. 3 is a cross-sectional view for describing an interconnection structure of an integrated circuit semiconductor device, according to an embodiment of inventive concepts.
Figure 4:
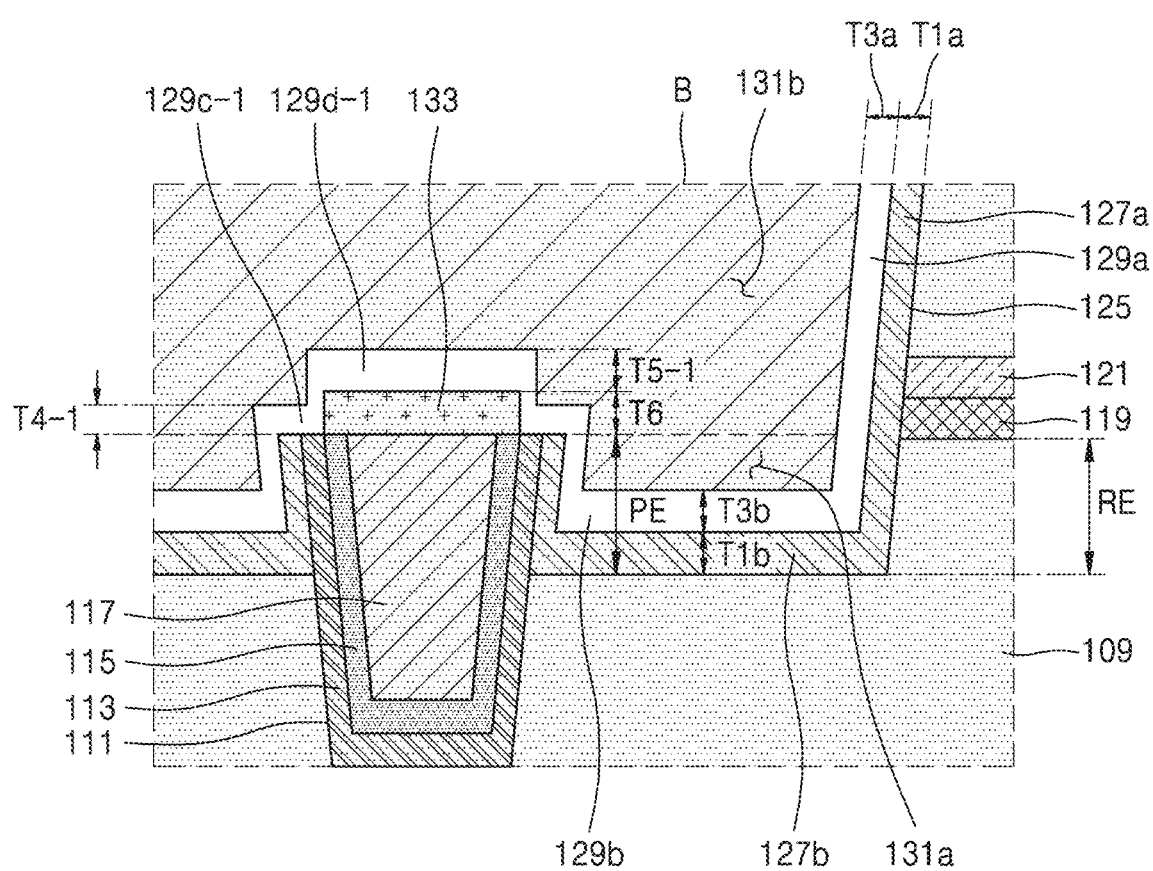
FIG. 4 is an enlarged view of a region B in FIG. 3.

FIG. 3 is a cross-sectional view for describing an interconnection structure 20 of an integrated circuit semiconductor device, according to an embodiment of inventive concepts, and FIG. 4 is an enlarged view of a region B in FIG. 3.

The interconnection structure 20 of the integrated circuit semiconductor device may be the same as the interconnection structure 10 in FIGS. 1 and 2 in comparison, except for a forming location of a barrier film 127-1, a forming location of a conductive seed layer 129-1, and whether a cap layer 133 is formed. In the descriptions of FIGS. 3 and 4, duplicate descriptions of FIGS. 1 and 2 are the same, and thus are omitted.

In the interconnection structure 20 of the integrated circuit semiconductor device, the conductive plug 105 and the first conductive layer 107 may be formed in the first interlayer insulating layer 103 on the semiconductor substrate 101. A second interlayer insulating layer 109, an etch stop layers (119 and 121), and a third interlayer insulating layer 123 may be formed on the first conductive layer 107.

The trench 125 may be formed in the second interlayer insulating layer 109, the etch stop layers (119 and 121), and the third interlayer insulating layer 123. In the trench 125, the via structures (113, 115, and 117) that penetrate some portion of the second interlayer insulating layer 109 and contact the first conductive layer 107 may be formed. The via structures (113, 115, and 117) may include the via barrier layer 113 formed inside and on the bottom of the via hole 111, the via seed layer 115 formed on the via barrier layer 113, and the via layer 117 formed to bury the via hole 111 on the via seed layer 115.

The interconnection structure 20 of the integrated circuit semiconductor device may include upper conductive structures (133, 127-1, 129-1, and 131) that are in contact with the via structures (113, 115, and 117) while filling the trench 125.

The cap layer 133 constituting the upper conductive structures (133, 127-1, 129-1, and 131) may be selectively formed on the via seed layer 115 and the via layer 117. The cap layer 133 may include the same material as the conductive seed layer 129-1. The cap layer 133 may include Co or Ru. As illustrated in FIG. 4, the cap layer 133 may have a sixth thickness T6. The barrier film 127-1 may be selectively formed on the sidewalls and the bottom of the trench 125.

The barrier film 127-1 may not be formed selectively on the via structures (113, 115, and 117), in particular, on the top surface of the via layer 117. As illustrated in FIG. 4, the barrier film 127-1 may include the first portion 127a formed on the sidewall of the trench 125, and the second portion 127b formed on the bottom of the trench 125 and some side surfaces of the via barrier layer 113.

The conductive seed layer 129-1 may be formed on the barrier film 127-1 and the cap layer 133. As illustrated in FIG. 4, the conductive seed layer 129-1 may include the first portion 129a formed on the sidewall of the via barrier layer 113 of the trench 125, the second portion 129b formed on the barrier film 127b that is formed on the bottom of the trench 125 and on some side surfaces of the via barrier layer 113, a third portion 129c-1 formed on the via barrier layer 113, and a fourth portion 129d-1 formed on the cap layer 133.

The conductive seed layer 129-1 may have the third thicknesses (T3a and T3b), a fourth thickness T4-1, and a fifth thickness T5-1. The first portion 129a of the conductive seed layer 129-1 may have a third sub thickness T3a. The second portion 129b of the conductive seed layer 129-1 may have a fourth sub thickness T3b that is greater than the third sub thickness T3a. The fourth portion 129c-1 of the conductive seed layer 129-1 may have the fourth thickness T4-1 that is less than the third thicknesses (T3a and T3b), and the fourth portion 129d-1 of the conductive seed layer 129-1 may have the fifth thickness T5-1 that is greater than the fourth thickness T4-1.

The second conductive layer 131 formed to bury the trench 125 may be included on the conductive seed layer 129-1. The second conductive layer 131 may include a first portion 131a at the same height as the upper surface of the via structures (113, 115, and 117), for example, of the upper surface of the via layer 117, and a second portion 131b at the same height as the upper surface of the third interlayer insulating layer 123 on the first portion 131a, and the first portion 131a and the second portion 131b may be configured in one body.

The interconnection structure 20 of the integrated circuit semiconductor device may include the cap layer 133 including the same material as the conductive seed layer 129-1 on the via structures (113, 115, and 117), for example, on the via layer 117. Accordingly, the interconnection structure 20 may reduce the contact resistance between the upper conductive structures (127, 129, and 131) and the via structures (113, 115, and 117). As a result, the interconnection structure 20 of the integrated circuit semiconductor device may reduce the via resistance of the via layer 117.

Figure 5:
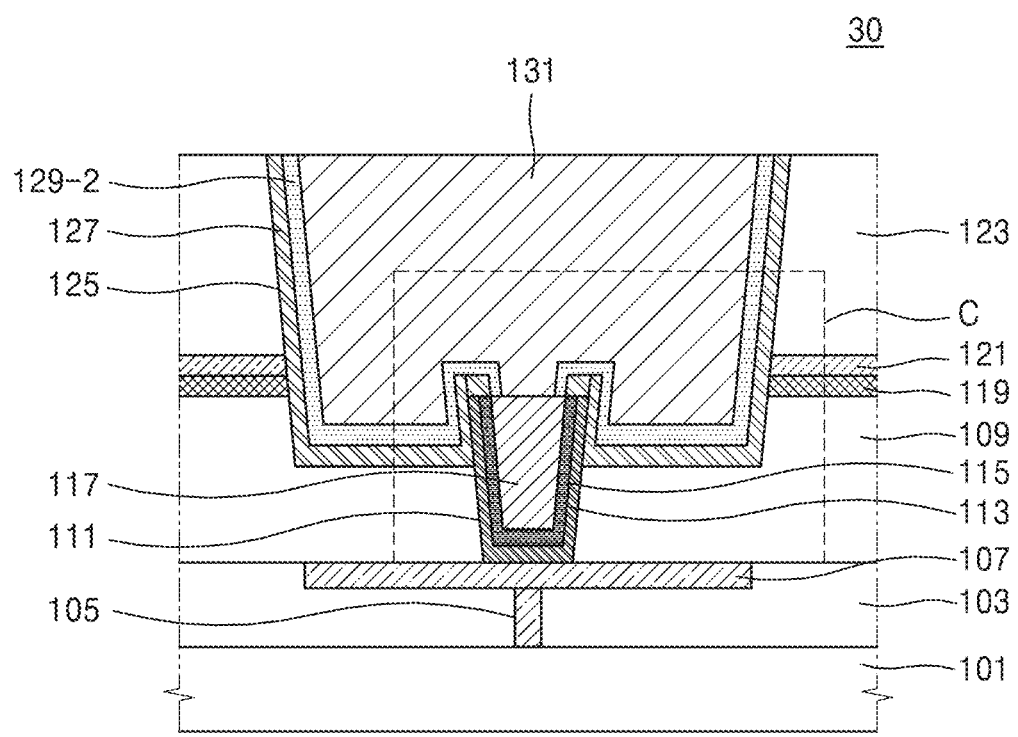
FIG. 5 is a cross-sectional view for describing an interconnection structure of an integrated circuit semiconductor device, according to an embodiment of inventive concepts.
Figure 6:
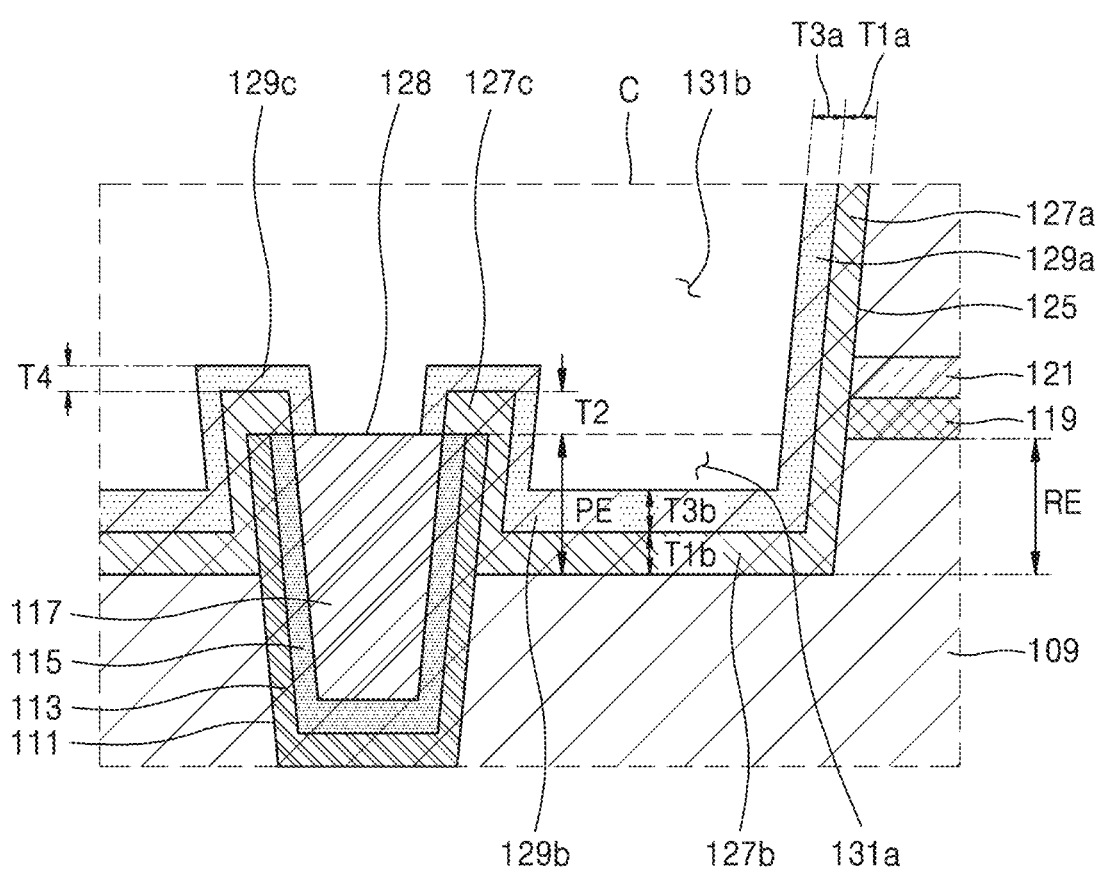
FIG. 6 is an enlarged view of a region C in FIG. 5.

FIG. 5 is a cross-sectional view for describing an interconnection structure 30 of an integrated circuit semiconductor device, according to an embodiment of inventive concepts, and FIG. 6 is an enlarged view of a region C in FIG. 5.

The interconnection structure 30 of the integrated circuit semiconductor device may be the same as the interconnection structure 10 of FIGS. 1 and 2 in comparison, except for a forming location of a conductive seed layer 129-2. In the descriptions of FIGS. 5 and 6, duplicate descriptions of FIGS. 1 and 2 are the same, and thus are omitted.

In the interconnection structure 30 of the integrated circuit semiconductor device, the conductive plug 105 and the first conductive layer 107 may be formed in the first interlayer insulating layer 103 on the semiconductor substrate 101. A second interlayer insulating layer 109, the etch stop layers (119 and 121), and the third interlayer insulating layer 123 may be formed on the first conductive layer 107.

The trench 125 may be formed in the second interlayer insulating layer 109, the etch stop layers (119 and 121), and the third interlayer insulating layer 123. In the trench 125, the via structures (113, 115, and 117) that penetrate some portion of the second interlayer insulating layer 109 and contact the first conductive layer 107 may be formed. The via structures (113, 115, and 117) may include the via barrier layer 113 formed inside and on the bottom of the via hole 111, the via seed layer 115 formed on the via barrier layer 113, and the via layer 117 formed to fill the via hole 111.

The interconnection structure 30 of the integrated circuit semiconductor device may include upper conductive structures (127, 129-2, and 131) that are in contact with the via structures (113, 115, and 117) while filling the trench 125.

The barrier film 127 may be selectively formed on the sidewalls and the bottom of the trench 125. The barrier film 127 may not be formed selectively on the via structures (113, 115, and 117), in particular, on the top surface of the via layer 117. As illustrated in FIG. 6, the barrier film 127 may include the first portion 127a formed on the sidewall of the trench 125, the second portion 127b formed on the bottom of the trench 125 and some side surfaces of the via barrier layer 113, and the third portion 127c formed on the via barrier layer 113 and the via seed layer 115.

The conductive seed layer 129-2 may be formed on the barrier film 127. As illustrated in FIG. 6, the conductive seed layer 129-2 may include the first portion 129a formed on the sidewall of the barrier film 127a of the trench 125, the second portion 129b formed on the barrier film 127b that is formed on the bottom of the trench 125 and on some side surfaces of the via barrier layer 113, and the third portion 129c formed on the barrier film 127c on the via barrier layer 113 and the via seed layer 115.

The second conductive layer 131 formed to bury the trench 125 may be formed on the conductive seed layer 129-2. The second conductive layer 131 may include a first portion 131a at the same height as the upper surface of the via structures (113, 115, and 117), for example, the upper surface of the via layer 117, and a second portion 131b at the same height as an upper surface of the third interlayer insulating layer 123 on the first portion 131a, and the first portion 131a and the second portion 131b may be configured in one body.

In the interconnection structure 30 of the integrated circuit semiconductor device, the via structures (113, 115, and 117), for example, the via layer 117, may be in direct contact with the second conductive layer 131, and thus, the contact resistance between the upper conductive structures (127, 129-2, and 131) and the via structures (113, 115, and 117) may be reduced. Accordingly, the interconnection structure 30 of the integrated circuit semiconductor device may reduce the via resistance of the via layer 117.

FIGS. 7 through 12 are cross-sectional views of a manufacturing method of an integrated circuit semiconductor device, according to embodiments of inventive concepts.

FIGS. 7 through 12 are provided to describe the manufacturing method of the interconnection structure 10 of the integrated circuit semiconductor device of FIGS. 1 and 2. In FIGS. 7 through 12, the second interlayer insulating layer 109 in FIGS. 1 and 2 is first described for convenience.

Figure 7:
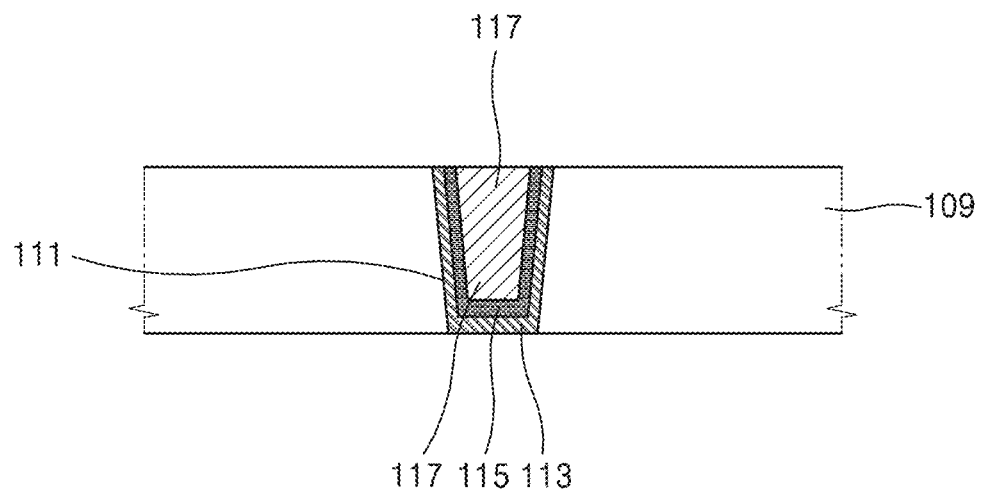
FIGS. 7 through 12 are cross-sectional views of a manufacturing method of an integrated circuit semiconductor device, according to embodiments of inventive concepts.

Referring to FIG. 7, the via structures (113, 115, and 117) may be formed in the second interlayer insulating layer 109. A formation order of the via structures (113, 115, and 117)

may be as follows. The via hole 111 may be formed in the second interlayer insulating layer 109 by using a photolithography process. Next, the via barrier layer 113 may be formed inside and on the bottom of the via hole 111. The via barrier layer 113 may be formed by using an ALD method, a CVD method, or a PVD method.

The via seed layer 115 may be formed on the via barrier layer 113. The via barrier layer 113 and the via seed layer 115 may be formed by using an ALD method, a CVD method, or a PVD method. The via layer 117 may be formed to fill the via hole 111 on the via seed layer 115. The via layer 117 may be formed by using an ALD method, a CVD method, a PVD method, or an electric plating method.

Although not illustrated in FIG. 7, from an aspect of manufacturing processes, a via barrier material layer, a via seed material layer, and a via material layer, which are formed on the top surface of the second interlayer insulating layer, may be etched by using a planarization process, for example, a chemical mechanical polishing process with the top surface of the second interlayer insulating layer 109 as the lowermost etching location.

Figure 8:
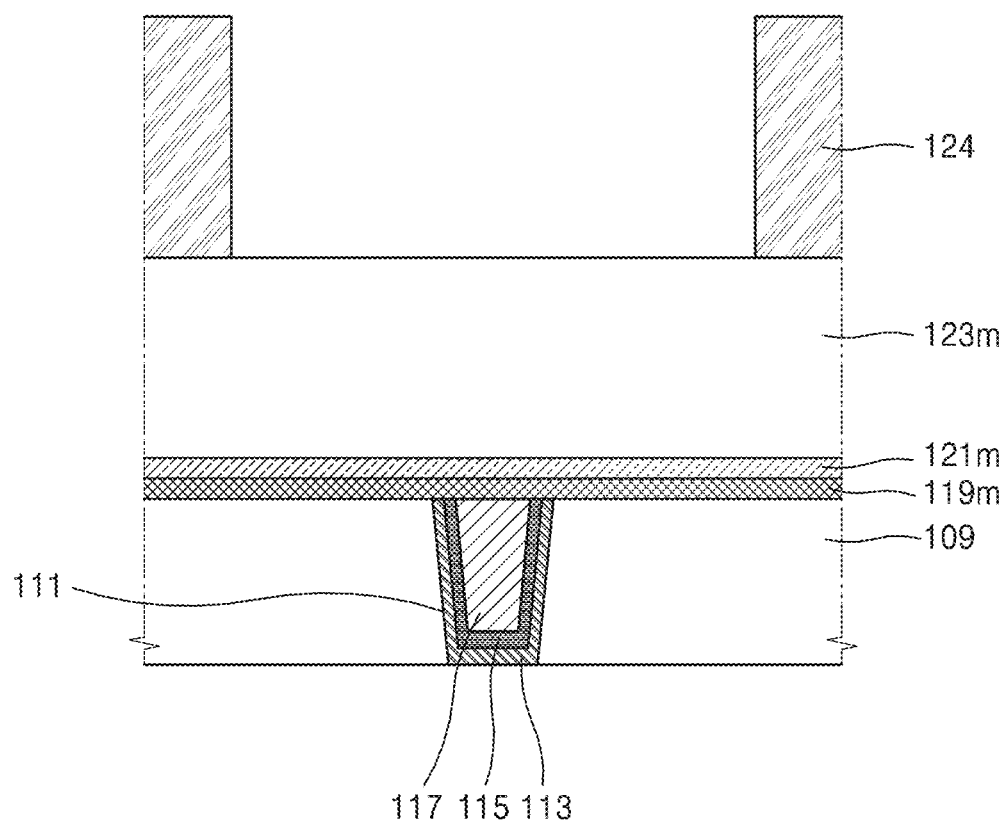
Figure 9:
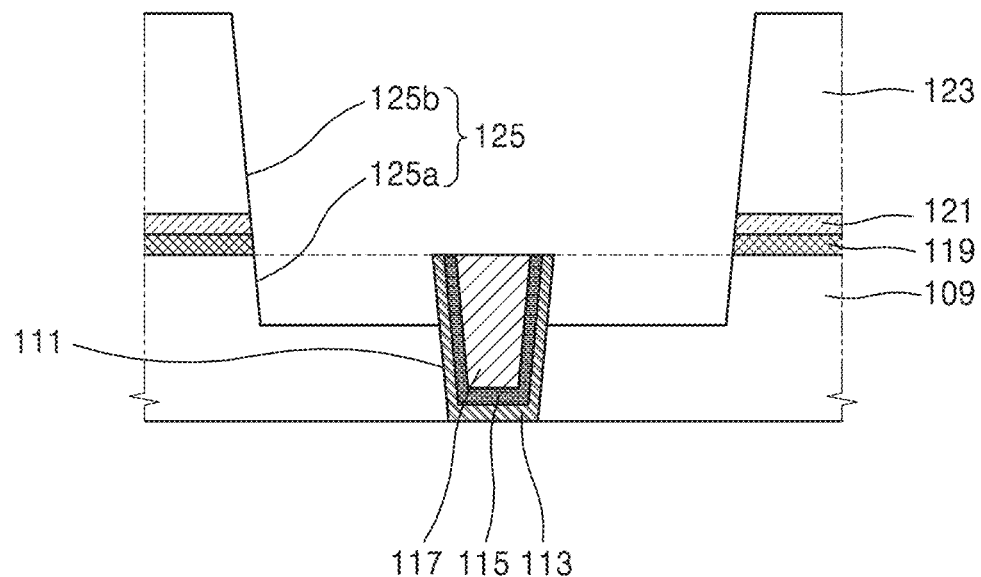

Referring to FIGS. 8 and 9, as illustrated in FIG. 8, a first etch stop material layer 119m, a second etch stop material layer 121m, and a third interlayer insulating material layer 123m may be sequentially formed on the second interlayer insulating layer 109. A mask pattern 124 may be formed on the third interlayer insulating material layer 123m by using the photolithography process. The mask pattern 124 may be formed by using a photoresist pattern.

As illustrated in FIG. 9, a first trench 125a may be formed by etching the third interlayer insulating material layer 123m with a bottom of the first etch stop material layer 119m as the etch lowermost location by using the mask pattern 124. When the first trench 125a is formed, the second etch stop material layer 121m and the first etch stop material layer 119m may be patterned, and the second etch stop layer 121 and the first etch stop layer 119 may be formed.

Next, after the first trench 125a is formed, by further etching the second interlayer insulating layer 109 by using the mask pattern 124 as an etch mask, a second trench 125b that is recessed below a lower surface or a bottom of the first etch stop layer 121 may be formed. When the second trench 125b is formed, the via structures (117, 115, and 113) may not be etched. The first trench 125a and the second trench 125b may be formed by a single etching process. The first trench 125a and the second trench 125b may be collectively referred to as the trench 125.

Figure 10:
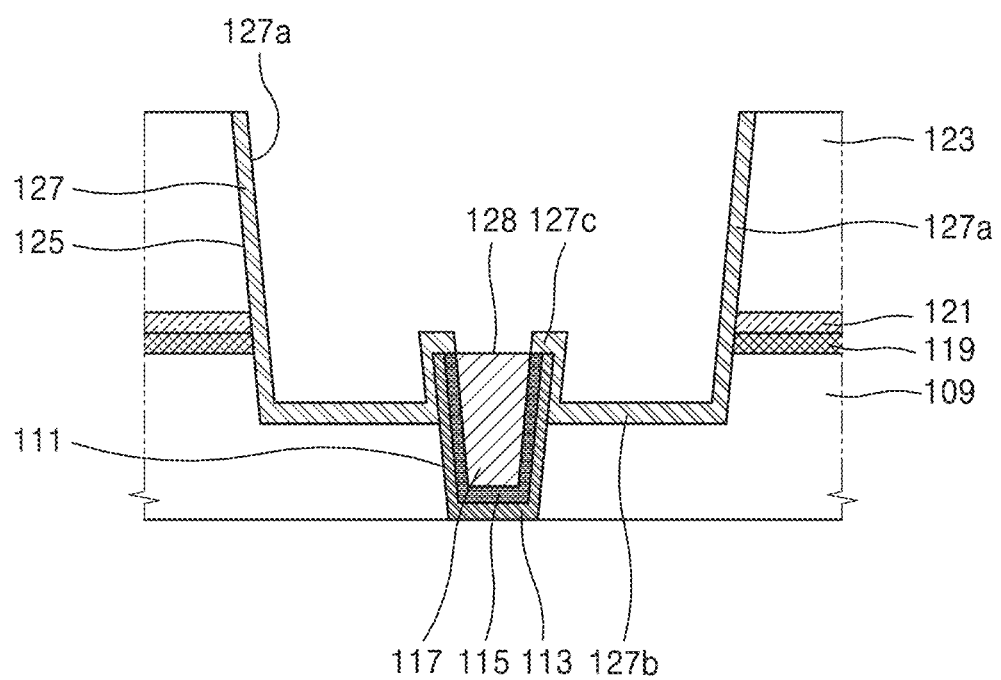
Figure 11:
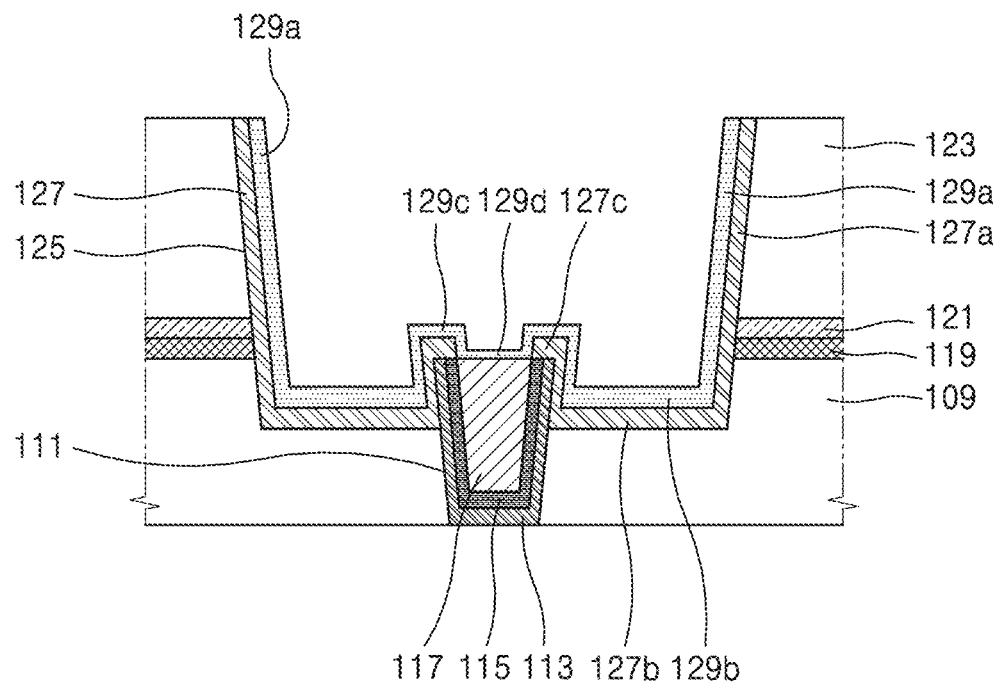

Referring to FIGS. 10 and 11, as illustrated in FIG. 10, the barrier film 127 may be selectively formed on the sidewalls and the bottom of the trench 125, and on the via barrier layer 113 and the via seed layer 115. The barrier film 127 may include the first portion 127a formed on the sidewall of the trench 125, the second portion 127b formed on the bottom of the trench 125 and some side surfaces of the via barrier layer 113, and the third portion 127c formed on the via barrier layer 113 and the via seed layer 115.

The barrier film 127 may not be selectively formed on the top surfaces of the via structures (113, 115, and 117), in particular, on the top surface 128 of the via layer 117. The barrier film 127c may not be formed on the via barrier layer 113 and the via seed layer 115. The barrier film 127 may be formed by using the ALD method, the CVD method, or the PVD method.

As illustrated in FIG. 11, the conductive seed layer 129 may be formed on the barrier film 127. The conductive seed layer 129 may be formed by using the ALD method, the CVD method, or the PVD method. The conductive seed layer 129 may include a first portion 129a formed on sidewalls of the barrier film 127a of the trench 125, a second portion 129b formed on the barrier film 127b that is formed on the bottom of the trench 125 and on some side surfaces of the via barrier layer 113, a third portion 129c formed on the barrier film 127c that is on the via barrier layer 113 and the via seed layer 115, and a fourth portion 129d formed on the via layer 117.

Figure 12:
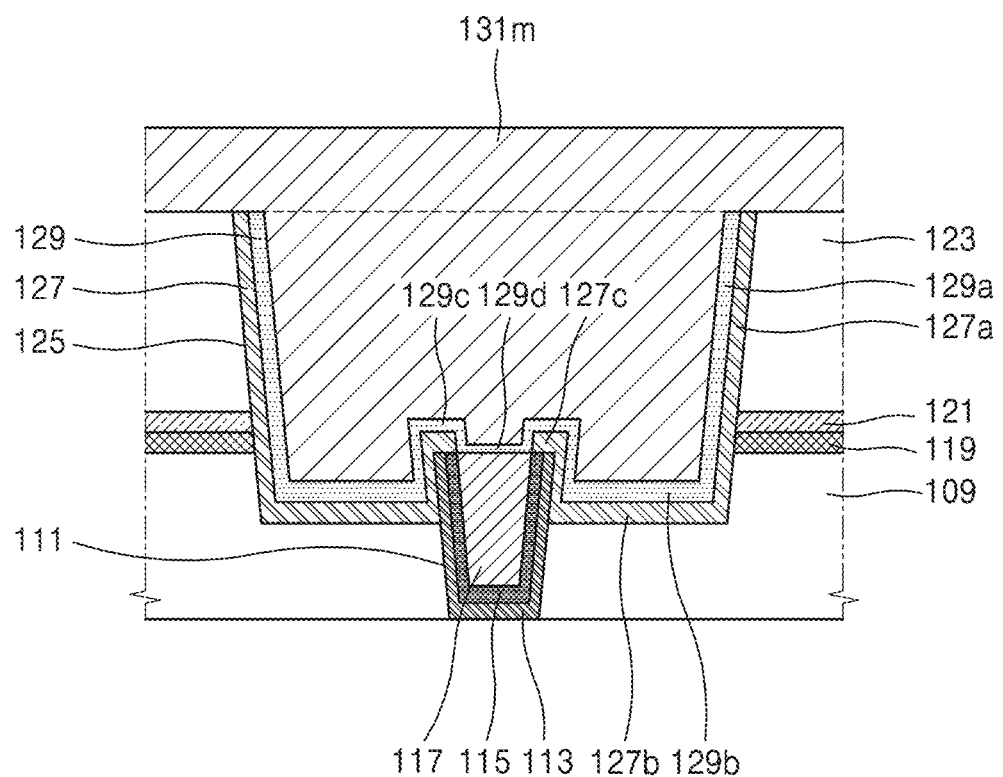

Referring to FIG. 12, a second conductive material layer 131m may be formed on the entire surface of the third interlayer insulating layer 123 so that the trench 125 on the conductive seed layer 129 is buried. The second conductive material layer 131m may be formed by using the ALD method, the CVD method, the PVD method, or the electric plating method.

Next, by etching the second conductive material layer 131m by using a planarization process, for example, the chemical mechanical polishing process with the top surface of the third interlayer insulating layer 123 as the lowermost etch location, the second conductive layer 131 illustrated in FIGS. 1 and 2 may be formed.

Accordingly, in the interconnect structure 10 illustrated in FIGS. 1 and 2, upper conductive structures (127, 129, and 131) that are electrically connected to the via structures (113, 115, and 117). The upper conductive structures (127, 129, and 131) may include the barrier film 127, the conductive seed layer 129, and the second conductive layer 131.

FIGS. 13 through 16 are cross-sectional views of a manufacturing method of the interconnection structure 20 of an integrated circuit semiconductor device, according to embodiments of inventive concepts.

Figure 13:
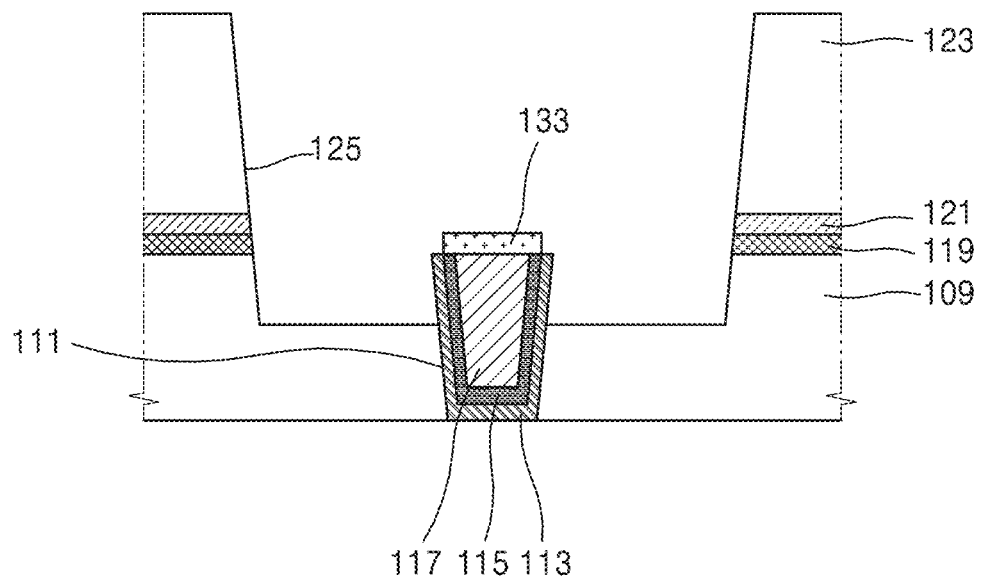
FIGS. 13 through 16 are cross-sectional views of a manufacturing method of an interconnection structure of an integrated circuit semiconductor device, according to embodiments of inventive concepts.
Figure 14:
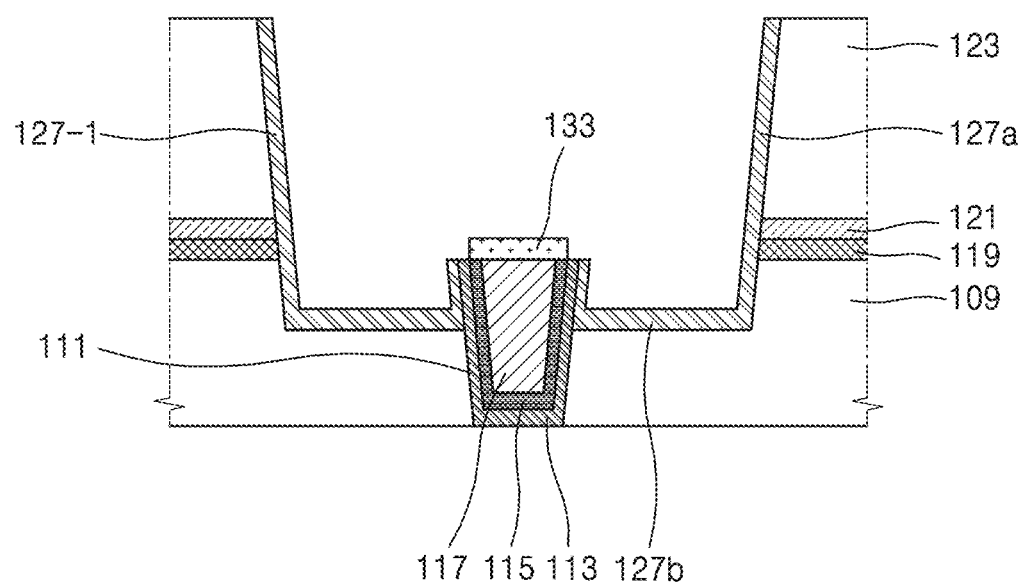
Figure 15:
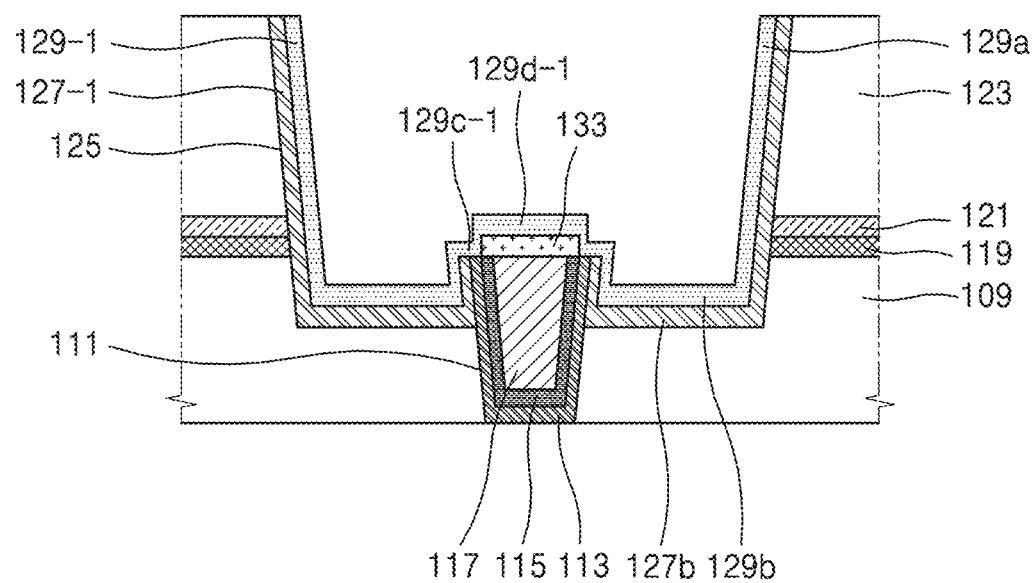
Figure 16:
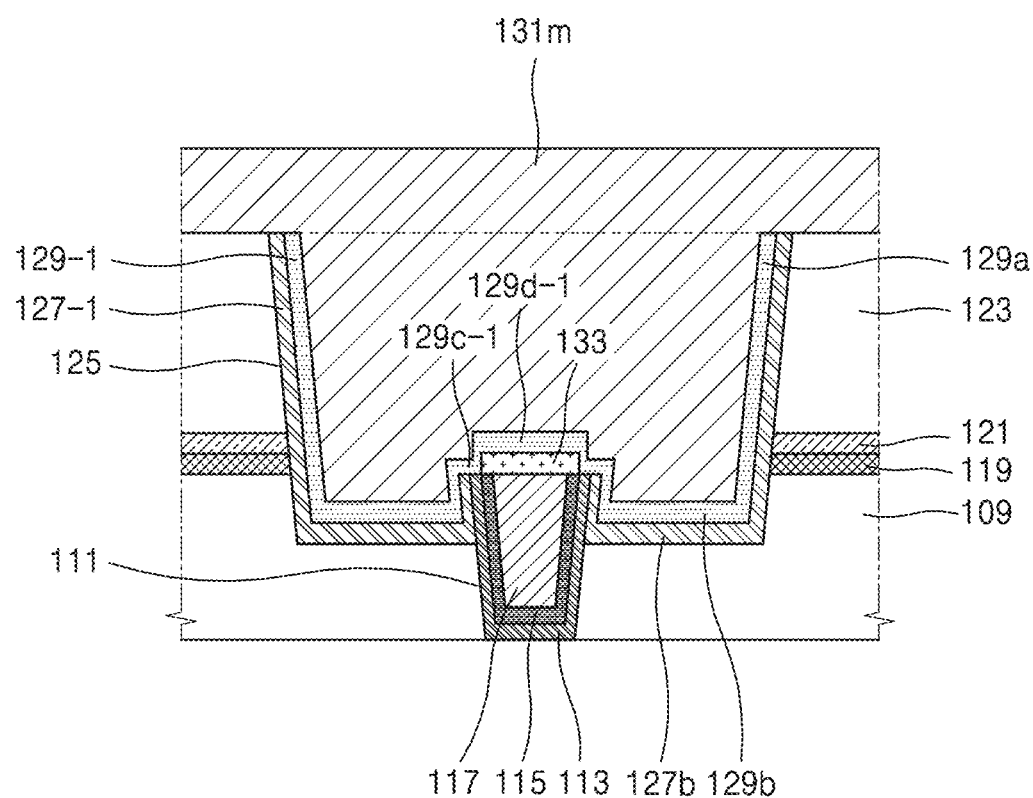

FIGS. 13 through 16 are provided to describe the manufacturing method of the interconnection structure 20 of the integrated circuit semiconductor device of FIGS. 3 and 4. In FIGS. 13 to 16, for convenience, the manufacturing method is described from a level of the second interlayer insulating layer 109 in FIGS. 3 and 4. In FIGS. 13 and 16, descriptions given with reference to FIGS. 7 through 12 are omitted.

The manufacturing processes of FIGS. 7 through 9 described above may be performed. Referring to FIG. 13, the cap layer 133 may be selectively formed on the via seed layer 115 and the via layer 117, as illustrated in FIG. 13. The cap layer 133 may include the same material as the conductive seed layer 129-1 that is to be formed later. The cap layer 133 may include Co or Ru.

Referring to FIG. 14, the barrier film 127-1 may be selectively formed on the sidewalls and the bottom of the trench 125. The barrier film 127-1 may include the first portion 127a formed on the sidewall of the trench 125, and the second portion 127b formed on the bottom of the trench 125 and some side surfaces of the via barrier layer 113. The barrier film 127-1 may not be selectively formed on the top surfaces of the via barrier layer 113 and the cap layer 133.

Referring to FIG. 15, the conductive seed layer 129-1 may be formed on the barrier film 127-1. The conductive seed layer 129-1 may include the first portion 129a formed on the sidewall of the barrier layer of the trench, the second portion 129b formed on the barrier film 127b that is formed on the bottom of the trench 125 and on some side surfaces of the via barrier layer 113, the third portion 129c-1 formed on the via barrier layer 113, and the fourth portion 129d-1 formed on the cap layer 133.

Referring to FIG. 16, the second conductive material layer 131m may be formed on the entire surface of the third interlayer insulating layer 123 so that the trench 125 on the conductive seed layer 129-1 is buried. Next, by etching the second conductive material layer 131m by using a planarization process, for example, the chemical mechanical polishing process with the top surface of the third interlayer insulating layer 123 as the lowermost etch location, the second conductive layer 131 illustrated in FIGS. 3 and 4 may be formed.

Accordingly, in the interconnect structure 20 illustrated in FIGS. 3 and 4, the upper conductive structures (127, 129, and 131) that are electrically connected to the via structures (113, 115, and 117). The upper conductive structures (127, 129, 131, and 133) may include the barrier film 127-1, the conductive seed layer 129-1, the second conductive layer 131, and the cap layer 133.

Figure 17:
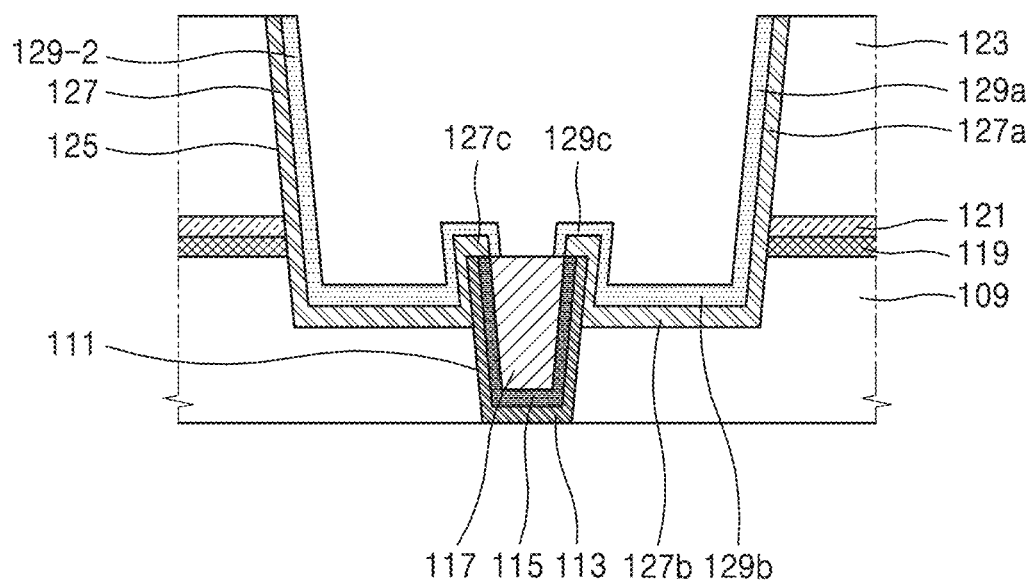
FIGS. 17 and 18 are cross-sectional views of a manufacturing method of an integrated circuit semiconductor device, according to embodiments of inventive concepts.
Figure 18:
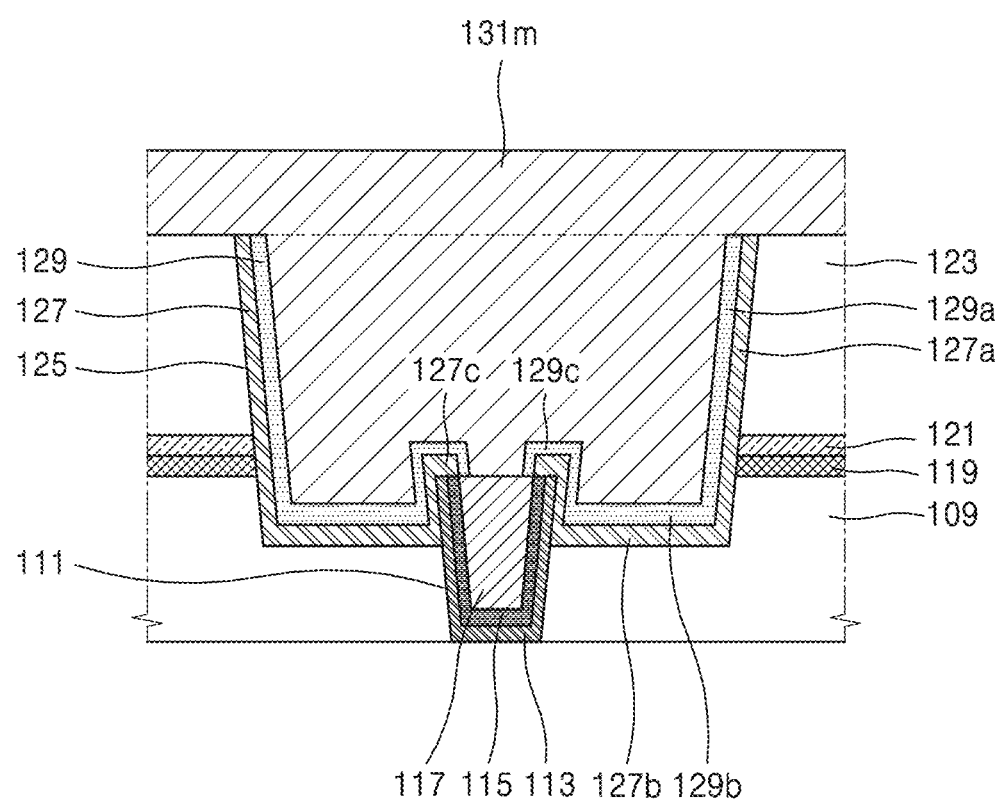

FIGS. 17 and 18 are cross-sectional views of a manufacturing method of the interconnection structure 30 of an integrated circuit semiconductor device, according to embodiments of inventive concepts.

FIGS. 17 and 18 are provided to describe the manufacturing method of the interconnection structure 30 of the integrated circuit semiconductor device of FIGS. 5 and 6. In FIGS. 17 and 18, for convenience, the manufacturing method is described from a level of the second interlayer insulating layer 109 in FIGS. 5 and 6. In FIGS. 17 and 18, descriptions given with reference to FIGS. 7 through 12 are omitted.

Referring to FIG. 17, the manufacturing processes of FIGS. 7 through 10 described above may be performed. As illustrated in FIG. 17, the conductive seed layer 129-2 may be formed on the barrier film 127. The conductive seed layer 129-2 may include the first portion 129a formed on the sidewall of the barrier film 127a of the trench 125, the second portion 129b formed on the barrier film 127b that is formed on the bottom of the trench 125 and on some side surfaces of the via barrier layer 113, and the third portion 129c formed on the barrier film 127c on the via barrier layer 113 and the via seed layer 115.

Referring to FIG. 18, the second conductive material layer 131m may be formed on the entire surface of the third interlayer insulating layer 123 so that the trench 125 on the conductive seed layer 129-2 is buried. Next, by etching the second conductive material layer 131m by using a planarization process, for example, the chemical mechanical polishing process with the top surface of the third interlayer insulating layer 123 as the lowermost etch location, the second conductive layer 131 illustrated in FIGS. 5 and 6 may be formed.

Accordingly, in the interconnect structure 30 illustrated in FIGS. 5 and 6, the upper conductive structures (127, 129-2, and 131) that are electrically connected to the via structures (113, 115, and 117) may be formed. The upper conductive structures (127, 129-2, and 131) may include the barrier film 127, the conductive seed layer 129-2, and the second conductive layer 131.

Figure 19:
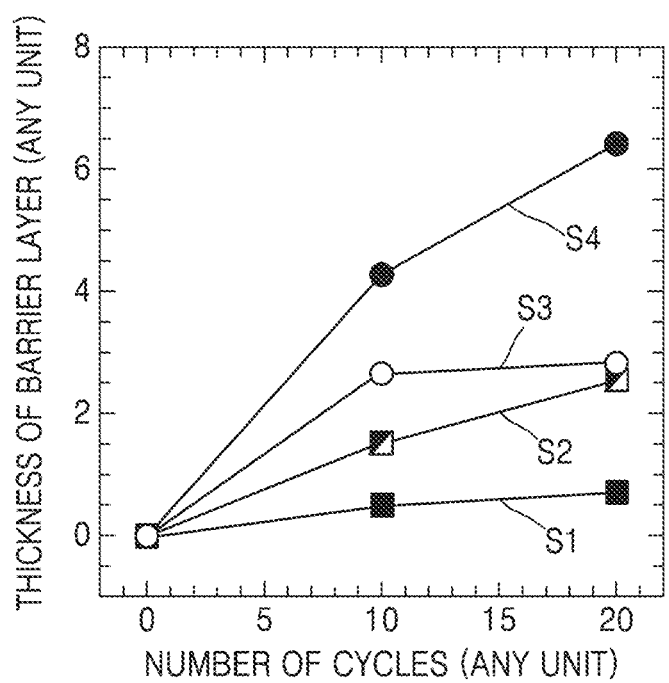
FIG. 19 is a diagram for explaining a method of selectively forming a barrier layer constituting an interconnection structure of an integrated circuit semiconductor device, according to an embodiment of inventive concepts.

FIG. 19 is a diagram for explaining a method of selectively forming a barrier layer constituting an interconnection structure of an integrated circuit semiconductor device, according to an embodiment of inventive concepts.

FIG. 19 illustrates an example of forming the barrier layer by an atomic layer deposition method. A horizontal axis may represent the number of cycles of precursor or purge gas when the atomic layer deposition method is performed, and a vertical axis may represent a thickness of the barrier layer, for example, a thickness of a TaN layer.

A sample S1 may represent the case of forming the barrier layer on a via layer, for example, a copper layer, and a sample S2 may represent the case of forming the barrier layer on a via layer, for example, a plasma-treated copper layer. A sample S3 may represent the case of forming the barrier layer on an interlayer insulating layer, for example, a plasma-treated silicon oxide layer, and a sample S4 may represent the case of forming the barrier layer on an interlayer insulating layer, for example, a silicon oxide layer.

It may be readily understood in the sample S1 that almost no barrier layer is formed on the copper layer as the number of cycles increases. It may be readily understood in the sample S2 that a little bit of the barrier layer is formed on the copper layer as the number of cycles increases.

It may be readily understood in the sample S3 that a little bit of the barrier layer is formed on the silicon oxide layer as the number of cycles increases. It may be readily understood in the sample S4 that the barrier layer is continuously formed on the silicon oxide layer as the number of cycles increases.

As described above, the barrier layer of inventive concepts may be selectively formed only on a trench on an interlayer insulating layer, for example, the silicon oxide layer, while the barrier layer is not formed on the via layer.

While inventive concepts has been particularly shown and described with reference to embodiments thereof, it will be understood that various changes in form and details may be made therein without departing from the spirit and scope of the following claims.

What is claimed is:

1. A method of manufacturing an interconnection structure of an integrated circuit semiconductor device, the method comprising:
    forming a first conductive layer on a semiconductor substrate;
    forming an interlayer insulating layer and a via layer on the first conductive layer, the via layer contacting the first conductive layer;
    forming a trench in the interlayer insulating layer to expose the via layer, the trench being recessed from a top surface of the interlayer insulating layer;
    forming a barrier film selectively on a bottom of the trench, sidewalls of the trench, and sidewalls of the via layer in the trench, such that the barrier film is not formed in contact with a top surface of the via layer during the forming the barrier film, the barrier film exposing the top surface of the via layer; and
    forming a second conductive layer inside the trench on the barrier film, the second conductive layer being electrically connected to the first conductive layer through the via layer, wherein
    the forming the barrier film selectively forms a first portion of the barrier film on the sidewalls of the trench and a second portion of the barrier film on the sidewalls of the via layer in the trench, and
    the first portion of the barrier film faces the second portion of the barrier film and is laterally spaced apart from the second portion of the barrier film.

2. The method of claim 1, further comprising:
    forming a via hole in a portion of the interlayer insulating layer;
    forming a via barrier layer inside the via hole and at a bottom of the via hole; and
    forming a via seed layer on the via barrier layer, wherein the via layer is formed on the via seed layer to bury the via hole.

3. The method of claim 1, wherein
    the barrier film provides an exposed top surface of the via layer, and
    the second conductive layer contacts the exposed top surface of the via layer.

4. The method of claim 1, wherein
the trench is recessed a level lower than a level of a surface of the via layer.

5. The method of claim 1, wherein
a width of the trench is greater than a width of the via layer.

6. The method of claim 1, further comprising:
forming a conductive seed layer on the barrier film and the via layer, wherein
the second conductive layer is formed on the conductive seed layer.

7. The method of claim 1, further comprising:
forming a conductive seed layer on the barrier film, wherein
the second conductive layer is formed on the conductive seed layer.

8. The method of claim 1, wherein
the interlayer insulating layer includes a first interlayer insulating layer surrounding the via layer, an etch stop layer on the first interlayer insulating layer, and a second interlayer insulating layer on the etch stop layer, and the second interlayer insulating layer and the second conductive layer are formed to be level with each other.

9. The method of claim 1, wherein
the second conductive layer includes a first portion surrounding the via layer,
the second conductive layer includes a second portion having a top surface level with a top surface of the interlayer insulating layer, and
the first portion of the second conductive layer and the second portion of the second conductive layer are formed in one body.

10. The method of claim 1, further comprising:
forming a cap layer on the top surface of the via layer; and
forming a conductive seed layer on the barrier film and the cap layer, wherein
the second conductive layer is formed on the conductive seed layer, and
the cap layer and the conductive seed layer is formed of an identical material.

11. The method of claim 1, wherein
the via layer penetrates a portion of the interlayer insulating layer and contacts the first conductive layer through a bottom of the trench, and
the via layer includes a protrusion protruding to a height greater than a height of the bottom of the trench.

12. A method of manufacturing an interconnection structure of an integrated circuit semiconductor device, the method comprising:
forming a first conductive layer on a semiconductor substrate;
forming an interlayer insulating layer and a via layer on the first conductive layer, the via layer contacting the first conductive layer;
forming a trench in the interlayer insulating layer to expose the via layer, the trench being recessed from a top surface of the interlayer insulating layer;
forming a barrier film selectively on a portion of a surface of the via layer, on a bottom of the trench, on sidewalls of the trench, and on sidewalls of the via layer in the trench, such that the barrier film is not formed in contact with a top surface of the via layer during the forming the barrier film, the barrier film exposing the top surface of the via layer; and
forming a second conductive layer on the via layer and the barrier film, the second conductive layer filling the trench and being electrically connected to the first conductive layer through the via layer,
the forming the barrier film selectively forms a first portion of the barrier film on the sidewalls of the trench and a second portion of the barrier film on the sidewalls of the via layer in the trench, and
the first portion of the barrier film faces the second portion of the barrier film and is laterally spaced apart from the second portion of the barrier film.

13. The method of claim 12, wherein
the trench is recessed lower than the surface of the via layer, and
the barrier film is formed on the bottom of the trench and the sidewalls of the trench.

14. The method of claim 13, further comprising:
forming a conductive seed layer on upper portions of the barrier film and the via layer, wherein
the second conductive layer is formed on the conductive seed layer.

15. The method of claim 12, further comprising:
forming a conductive seed layer selectively on the barrier film, wherein
the second conductive layer is formed on the conductive seed layer.

16. The method of claim 12, wherein
the interlayer insulating layer including a first interlayer insulating layer surrounding the via layer, an etch stop layer on the first interlayer insulating layer, and a second interlayer insulating layer on the etch stop layer,
the second interlayer insulating layer and the second conductive layer are formed to have level with each other,
the second conductive layer includes a first portion at an identical height to a height of the via layer,
the second conductive layer includes a second portion having a top surface level with a top surface of the interlayer insulating layer, and
the first portion of the second conductive layer and the second portion of the second conductive layer are formed in one body.

17. The method of claim 12, wherein
the forming the interlayer insulating layer and the via layer on the first conductive layer includes forming a via hole in the interlayer insulating layer and forming the via layer in the via hole to contact the first conductive layer,
the forming the barrier film selectively on the bottom of the trench, the sidewalls of the trench, and the sidewalls of the via layer in the trench such that the barrier film is not formed in contact with the top surface of the via layer during the forming the barrier film includes forming a cap layer on the top surface of the via layer,
the second conductive layer is electrically connected to the first conductive layer through the cap layer and the via layer, and
the barrier film does not extend laterally between the top surface of the via layer and a bottom surface of the second conductive layer.

18. The method of claim 17, further comprising:
forming a via barrier layer inside the via hole and at a bottom of the via hole; and
forming a via seed layer on the via barrier layer, wherein
the via layer is formed on the via seed layer and buries the via hole, and
the cap layer is formed on the via seed layer.

19. The method of claim 17, further comprising:
forming a conductive seed layer on the barrier film and the cap layer, wherein
the second conductive layer is formed on the conductive seed layer, wherein
the cap layer and the conductive seed layer is formed of an identical material.

20. The method of claim 19, wherein
the via layer penetrates a portion of the interlayer insulating layer and contacts the first conductive layer through a bottom of the trench, and
the via layer includes a protrusion protruding to a height greater than a height of the bottom of the trench.

* * * * *